US011731396B2

(12) United States Patent
Zhou et al.

(10) Patent No.: US 11,731,396 B2
(45) Date of Patent: Aug. 22, 2023

(54) DEFORMABLE STRUCTURE, FLEXIBLE BASE, FLEXIBLE DISPLAY DEVICE, AND STRAIN SENSOR

(71) Applicants: BEIJING BOE DISPLAY TECHNOLOGY CO., LTD., Beijing (CN); BOE TECHNOLOGY GROUP CO., LTD., Beijing (CN)

(72) Inventors: Junli Zhou, Beijing (CN); Qiang Li, Beijing (CN); Liangliang Zhao, Beijing (CN); Pingli Li, Beijing (CN); Qingyan Zhang, Beijing (CN); Yang Liu, Beijing (CN); Chunli Jie, Beijing (CN); Xiuli Liu, Beijing (CN); Yanqiu Li, Beijing (CN); Kaipeng Fu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 454 days.

(21) Appl. No.: 16/970,712

(22) PCT Filed: Feb. 27, 2020

(86) PCT No.: PCT/CN2020/076866
§ 371 (c)(1),
(2) Date: Aug. 18, 2020

(87) PCT Pub. No.: WO2020/215886
PCT Pub. Date: Oct. 29, 2020

(65) Prior Publication Data
US 2021/0094260 A1 Apr. 1, 2021

(30) Foreign Application Priority Data
Apr. 26, 2019 (CN) .......................... 201910346337.0

(51) Int. Cl.
B32B 7/10 (2006.01)
B32B 9/04 (2006.01)
(Continued)

(52) U.S. Cl.
CPC .................. *B32B 7/10* (2013.01); *B32B 9/04* (2013.01); *G01B 7/24* (2013.01); *H01L 25/0753* (2013.01);
(Continued)

(58) Field of Classification Search
None
See application file for complete search history.

(56) References Cited

U.S. PATENT DOCUMENTS 10,528,161 B2 * 1/2020 Chen ....................... G06F 3/041
11,264,582 B2 * 3/2022 Lin ......................... H01L 51/502
(Continued)

FOREIGN PATENT DOCUMENTS

CN 104730037 A 6/2015
CN 105378063 A 3/2016
(Continued)

OTHER PUBLICATIONS

First Office Action for related CN App No. 201910346337.0 dated Apr. 30, 2020, 11 pgs.
Notification of Second Office Action for related CN App No. 201910346337.0 dated Jan. 6, 2021, 9 pgs.

*Primary Examiner* — Kevin M Bernatz
(74) *Attorney, Agent, or Firm* — Procopio, Cory, Hargreaves & Savitch LLP

(57) ABSTRACT

A deformable structure includes a first deformable layer, and a material of the first deformable layer includes a deformable material. The deformable material includes a plurality of sheet structures that are stacked, and each sheet structure includes a plurality of aldolases. A molecular model of an aldolase is equivalent to a square on a plane where the sheet (Continued)

structure is located, and the aldolase has amino acid residues at each of four corners thereof. In one sheet structure, amino acid residues at four corners of each aldolase are connected to amino acid residues of four aldolases around the aldolase through four disulfide bonds, respectively. In two adjacent sheet structures, amino acid residues of two adjacent aldolases are connected through at least one disulfide bond.

17 Claims, 12 Drawing Sheets

(51) Int. Cl.
*G01B 7/24* (2006.01)
*H01L 25/075* (2006.01)

(52) U.S. Cl.
CPC ... *B32B 2307/208* (2013.01); *B32B 2307/734* (2013.01); *B32B 2457/20* (2013.01)

(56) References Cited

U.S. PATENT DOCUMENTS

| | | |
|---|---|---|
| 11,286,277 B2 * | 3/2022 | Tezcan ............ C12N 9/16 |
| 11,349,094 B2 * | 5/2022 | Kim ............ B82Y 20/00 |
| 2003/0033636 A1 | 2/2003 | Staub |
| 2014/0255369 A1 | 9/2014 | Turner et al. |
| 2015/0177139 A1 | 6/2015 | Kim |

FOREIGN PATENT DOCUMENTS

| | | |
|---|---|---|
| CN | 110065267 A | 7/2019 |
| WO | 2001027308 A2 | 4/2001 |
| WO | 2009016388 A1 | 2/2009 |
| WO | 2013082138 A1 | 6/2013 |
| WO | 2015083029 A1 | 6/2015 |

* cited by examiner

DEFORMABLE STRUCTURE, FLEXIBLE BASE, FLEXIBLE DISPLAY DEVICE, AND STRAIN SENSOR

CROSS-REFERENCE TO RELATED APPLICATIONS

This application is a national phase entry under 35 USC 371 of International Patent Application No. PCT/CN2020/076866 filed on Feb. 27, 2020, which claims priority to Chinese Patent Application No. 201910346337.0 filed on Apr. 26, 2019, which are incorporated herein by reference in their entirety.

TECHNICAL FIELD

The present disclosure relates to the field of flexible technologies, and in particular, to a deformable structure, a flexible base, a flexible display device, and a strain sensor.

BACKGROUND

At present, deformation occurs in many products, such as flexible display devices or strain sensors.

SUMMARY

In one aspect, a deformable structure is provided, and the deformable structure includes a first deformable layer. A material of the first deformable layer includes a deformable material. The deformable material includes a plurality of sheet structures that are stacked, and each sheet structure includes a plurality of aldolases. A molecular model of an aldolase is equivalent to a square on a plane where the sheet structure is located, and the aldolase has amino acid residues at each of four corners thereof. In one sheet structure, amino acid residues at four corners of each aldolase are connected to amino acid residues of four aldolases around the aldolase through four disulfide bonds, respectively. In two adjacent sheet structures, amino acid residues of two adjacent aldolases are connected through at least one disulfide bond.

In some embodiments, disulfide bonds are formed by oxidation of cysteines connected to amino acid residues of the aldolases.

In some embodiments, a Poisson ratio of the deformable material is a negative number.

In some embodiments, the material of the first deformable layer further includes magnetizable particles.

In some embodiments, the magnetizable particles include one or more of neodymium iron boron alloy particles, aluminum nickel cobalt alloy particles, iron chromium cobalt alloy particles, samarium cobalt alloy particles, ferrite particles, samarium iron nitrogen particles and aluminum iron carbon particles.

In some embodiments, the material of the first deformable layer further includes at least one of an organic silicone resin, a catalyst, a cross-linking agent and a rheological agent.

In some embodiments, the deformable structure further includes a second deformable layer. The first deformable layer and the second deformable layer are stacked in a thickness direction of the deformable structure. A material of the second deformable layer includes magnetizable particles.

In some embodiments, the magnetizable particles include one or more of neodymium iron boron alloy particles, aluminum nickel cobalt alloy particles, iron chromium cobalt alloy particles, samarium cobalt alloy particles, ferrite particles, samarium iron nitrogen particles and aluminum iron carbon particles.

In some embodiments, the material of the second deformable layer further includes at least one of an organic silicone resin, a catalyst, a cross-linking agent and a rheological agent.

In another aspect, a flexible base is provided. The flexible base includes the deformable structure as described above.

In yet another aspect, a flexible display device is provided. The flexible display device includes the flexible base as described above. Or, the flexible display device includes a third deformable layer, and a material of the third deformable layer includes two-dimensional silver sulfide ($Ag_2S$).

In some embodiments, the flexible base includes the third deformable layer, and the material of the third deformable layer further includes magnetizable particles.

In some embodiments, the material of the third deformable layer further includes at least one of an organic silicone resin, a catalyst, a cross-linking agent, and a rheological agent.

In some embodiments, the flexible display device further includes: a driving circuit layer disposed on the flexible base; and a plurality of micro light-emitting diode particles disposed on a side of the driving circuit layer away from the flexible base.

In yet another aspect, a strain sensor is provided. The strain sensor includes a strain sensing element, and the strain sensing element is deformed when subjected to a force. The strain sensing element includes the deformable structure as described above. Or, the strain sensing element includes a third deformable layer, and a material of the third deformable layer includes two-dimensional silver sulfide ($Ag_2S$).

In some embodiments, the strain sensing element includes the third deformable layer, and the material of the third deformable layer further includes magnetizable particles.

In some embodiments, the material of the third deformable layer further includes at least one of an organic silicone resin, a catalyst, a cross-linking agent and a rheological agent.

BRIEF DESCRIPTION OF THE DRAWINGS

In order to describe technical solutions in the present disclosure more clearly, accompanying drawings to be used in some embodiments of the present disclosure will be introduced briefly. Obviously, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, and are not limitations on an actual size of a product and an actual process of a method that the embodiments of the present disclosure relate to.

DETAILED DESCRIPTION

Technical solutions in some embodiments of the present disclosure will be described clearly and completely in combination with accompanying drawings. Obviously, the described embodiments are merely some but not all embodiments of the present disclosure. All other embodiments obtained on a basis of embodiments of the present disclosure by a person of ordinary skill in the art shall be included in the protection scope of the present disclosure.

Unless the context requires otherwise, throughout the specification and claims, the term "comprise" and other forms thereof such as the third-person singular form "comprises" and the present participle form "comprising" are construed as an open and inclusive meaning, i.e., "included, but not limited to". In the description of the specification, terms such as "one embodiment", "some embodiments", "exemplary embodiments", "example", "specific example", or "some examples" are intended to indicate that specific features, structures, materials or characteristics related to the embodiment(s) or example(s) are included in at least one embodiment or example of the present disclosure. Schematic representations of the above terms do not necessarily refer to the same embodiment or example. In addition, the specific features, structures, materials or characteristics may be included in any one or more embodiments or examples in any suitable manner.

Terms such as "first" and "second" are only used for descriptive purposes, and are not to be construed as indicating or implying the relative importance or implicitly indicating the number of indicated technical features below. Thus, features defined by the terms "first" and "second" may explicitly or implicitly include one or more of the features.

In the description of the embodiments of the present disclosure, the term "a/the plurality of" means two or more unless otherwise specified.

In describing some embodiments, the term "connected" may be used to indicate that two or more components are in direct or indirect contact with each other. The embodiments disclosed herein are not necessarily limited to the contents herein.

The expression "at least one of A, B and C" has a same meaning as "at least one of A, B or C", and both include the following combinations of A, B and C: only A, only B, only C, a combination of A and B, a combination of A and C, a combination of B and C, and a combination of A, B and C.

The expression "A and/or B" includes the following three combinations: only A, only B, and a combination of A and B.

Figure 1A:
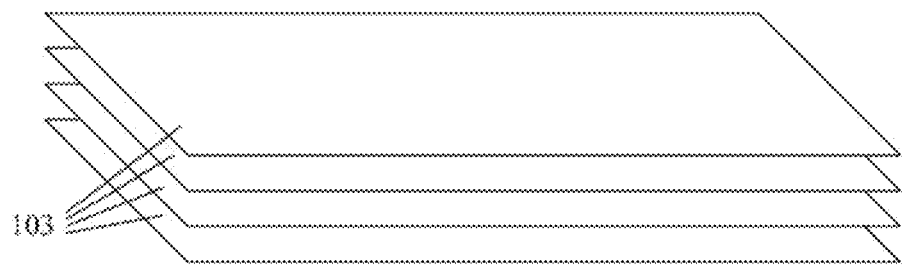
FIG. 1A is a structural diagram of a deformable material, according to some embodiments of the present disclosure.
Figure 1B:
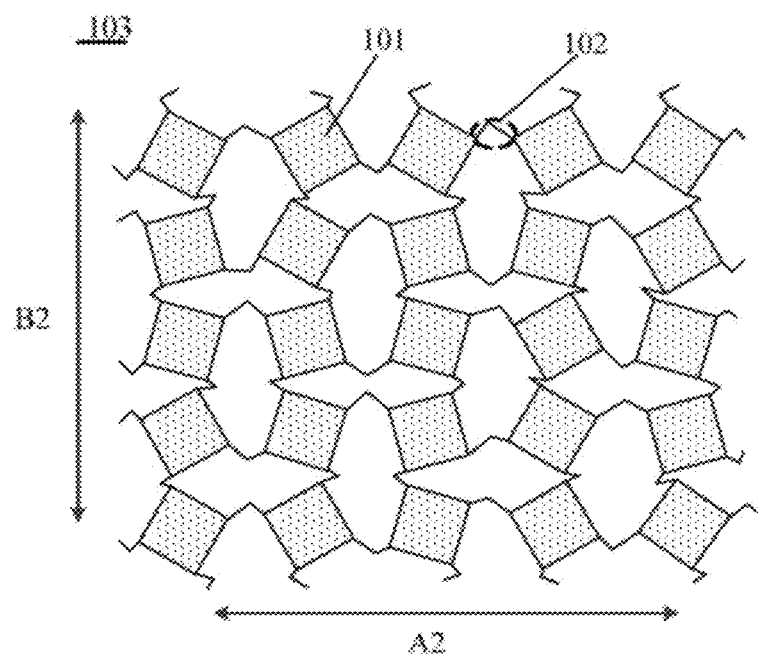
FIG. 1B is a structural diagram of a sheet structure in a deformable material, according to some embodiments of the present disclosure.
Figure 1C:
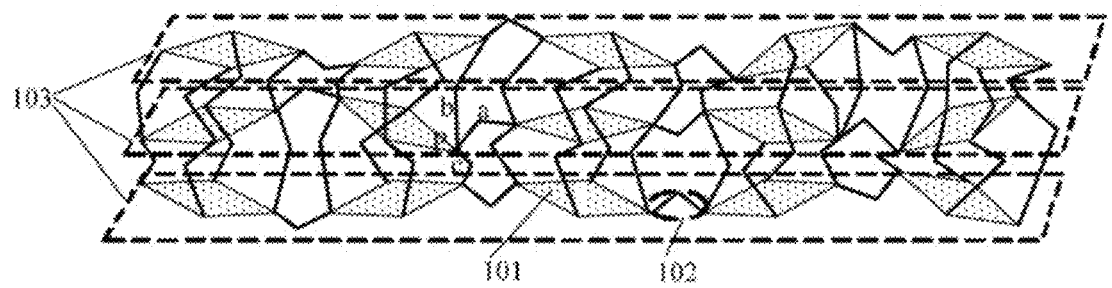
FIG. 1C is a schematic diagram of a connection manner of a plurality of sheet structures in a deformable material, according to some embodiments of the present disclosure.
Figure 1D:
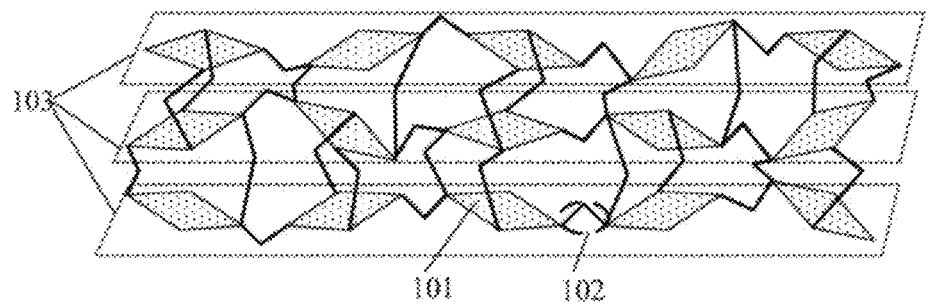
FIG. 1D is a schematic diagram of another connection manner of a plurality of sheet structures in a deformable material, according to some embodiments of the present disclosure.

Some embodiments of the present disclosure provide a deformable material. As shown in FIG. 1A, the deformable material has a plurality of sheet structures 103 that are stacked. As shown in FIG. 1B, each sheet structure 103 includes a plurality of aldolases 101, and a molecular model of an aldolase 101 may be equivalent to a square on a plane where the sheet structure is located. Each aldolase 101 has amino acid residues at each of four corners thereof, and the amino acid residues at the four corners of each aldolase 101 are connected to amino acid residues of four aldolases 101 around the aldolase 101 through four disulfide bonds 102, respectively. As shown in FIGS. 1C and 1D, amino acid residues of aldolases 101 in two adjacent sheet structures 103 are connected through disulfide bonds 102. Herein, the aldolase (CAS number: 9024-52-6) may be, for example, fructose 1,6-diphosphate aldolase, rhamnose phosphate aldolase, or the like.

FIG. 1A shows an example in which the deformable material includes four sheet structures 103 that are stacked. FIGS. 1C and 1D show an example in which the deformable material includes three sheet structures 103 that are stacked. It will be understood that the deformable material includes, but is not limited to four sheet structures or three sheet structures.

As shown in FIG. 1B, in a two-dimensional plane, the amino acid residues at the four corners of each aldolase 101 are connected to amino acid residues of four aldolases 101 around the aldolase 101 through four disulfide bonds 102, respectively. In this way, a plurality of square aldolases 101 may be connected together via the disulfide bonds 102 to form a two-dimensional sheet structure 103. As shown in FIG. 1A, a plurality of two-dimensional sheet structures 103 are stacked together to constitute the deformable material. Since amino acid residues of aldolases 101 in adjacent sheet structures 103 are connected through at least one disulfide bond 102, disulfide bonds 102 may connect a plurality of sheet structures 103 together. Herein, adjacent sheet structures 103 may be connected through one disulfide bond 102, and the disulfide bond 102 is connected to the amino acid residues of the aldolases 101 in the adjacent sheet structures 103; or adjacent sheet structures 103 may be connected through a plurality of disulfide bonds 102, and each disulfide bond 102 is connected to the amino acid residues of the aldolases 101 in the adjacent sheet structures 103. In a case where adjacent sheet structures 103 are connected through a plurality of disulfide bonds 102, with respect to two adjacent aldolases 101 located in the adjacent sheet structures 103, amino acid residues of the two adjacent aldolases 101 may be connected through one disulfide bond 102; or as shown in FIG. 1D, the amino acid residues of the two adjacent aldolases 101 may be connected through two disulfide bonds 102; of course, or as shown in FIG. 1C, the amino acid residues of the two adjacent aldolases 101 may be connected through four disulfide bonds 102. It will be noted that FIGS. 1C and 1D schematically illustrate a manner in which the plurality of sheet structures are connected through disulfide bonds 102. With respect to a manner in which the aldolases 101 in a same sheet structure 103 are connected through disulfide bonds 102, please refer to FIG. 1B.

It will be understood by those skilled in the art that, as shown in FIGS. 1B to 1D, the disulfide bond 102 is connected to the amino acid residue of the aldolase 101. If a corner of an aldolase 101 is connected to one adjacent aldolase 101, there will be one amino acid residue at the corner, if a corner of an aldolase 101 is connected to two adjacent aldolases 101, there will be two amino acid residues at the corner; and if a corner of an aldolase 101 is connected to three adjacent aldolases 101, there will be three amino acid residues at the corner.

For example, as shown in FIG. 1C, with respect to one aldolase 101, there are three amino acid residues at each corner. As shown in FIG. 1C, one amino acid residue of the aldolase 101 is connected to an amino acid residue of an adjacent aldolase 101, which is located in a same sheet structure 103 as the aldolase 101, through a disulfide bond 102; one amino acid residue of the aldolase 101 is connected to an amino acid residue of an adjacent aldolase 101, which is located above the aldolase 101, through a disulfide bond 102; one amino acid residue of the aldolase 101 is connected to an amino acid residue of an adjacent aldolase 101, which is located below the aldolase 101, through a disulfide bond 102. That is, amino acid residues at each corner of the aldolase 101 is connected to an aldolase in the same sheet structure 103 as the aldolase 101, an aldolase in a sheet structure 103 above the aldolase 101, and an aldolase in a sheet structure 103 below the aldolase 101 through three disulfide bonds 102. For example, as shown in FIG. 1C, one of amino acid residues at a corner p of the aldolase is connected to an adjacent aldolase in the same sheet structure 103 as the aldolase through a disulfide bond a, one is connected to an adjacent aldolase above the aldolase through a disulfide bond b, and one is connected to an adjacent aldolase below the aldolase through a disulfide bond c. Herein, there is no limitation on the method used to manufacture the deformable material.

In some embodiments, by chemically modifying the amino acid residues of the aldolase 101, the molecular model of which is equivalent to a square, cysteines are introduced to four corners thereof. Then, the cysteines are oxidized to form disulfide bonds 102 by utilizing an oxidant. As shown in FIG. 1B, the disulfide bonds 102 connect a plurality of square aldolases 101 together. Herein, the disulfide bond is a relatively stable covalent bond. With respect to a same sheet structure 103, the disulfide bonds 102 connect a plurality of aldolases 101, the molecular model of which each is equivalent to a square, together. Due to the existence of the disulfide bonds 102, amino acid residues, which are arranged randomly in the same disulfide bond 102 or different disulfide bonds 102 originally, move closer together and become more orderly, thereby further making the plurality of aldolases 101 arranged in order. Therefore, when the entire sheet structure 103 is deformed, the disulfide bonds may be rapidly folded or stretched, so that the structure of the sheet structure 103 may be stably changed.

The deformable material includes a plurality of two-dimensional sheet structures 103 that are stacked. The following describes in detail a microscopic change of one of the sheet structures 103 when it is deformed, and microscopic changes of other sheet structures 103 when they are deformed are the same as the microscopic change of the described sheet structure 103.

Figure 2:
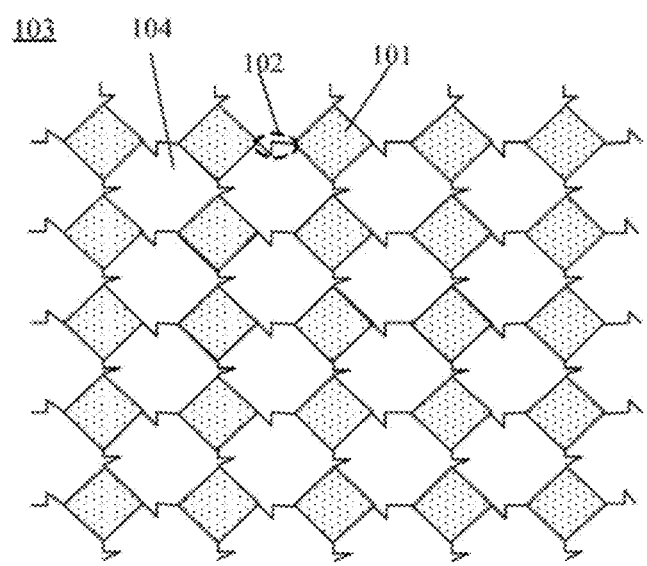
FIG. 2 is a structural diagram of the sheet structure in the deformable material shown in FIG. 1B after being stretched in direction A2 in FIG. 1B.
Figure 3:
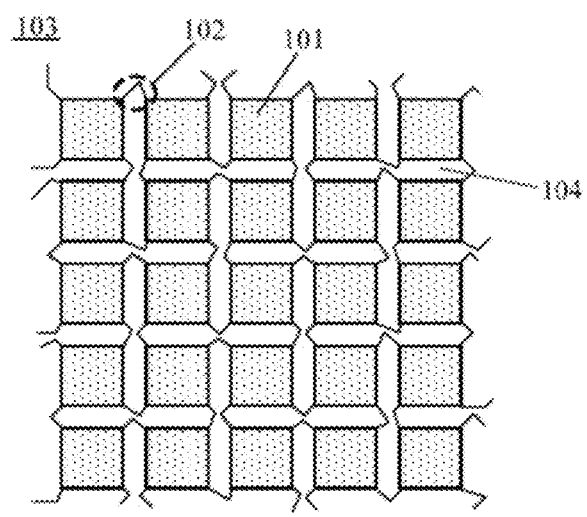
FIG. 3 is a structural diagram of the sheet structure in the deformable material shown in FIG. 1B after being compressed in direction B2 in FIG. 1B.

FIG. 1B illustrates a microstructure of the sheet structure 103 when no deformation occurs, that is, when the sheet structure 103 is not subjected to a force. FIG. 2 illustrates a microstructure of the sheet structure 103 in a stretched state. FIG. 3 illustrates a microstructure of the sheet structure 103 in a compressed state.

The sheet structure 103 is stretched in the direction A2 in FIG. 1B. Referring to FIG. 2, when the sheet structure 103 is stretched, the aldolases 101 are rotated, and pores 104 between adjacent aldolases 101 are open. Since a shape of the aldolase 101 is a square, dimensions of the sheet structure 103 increase with a same ratio in any directions in a two-dimensional plane where it is located, and a shape of the sheet structure 103 after being stretched is the same as a shape of the sheet structure 103 before being stretched. In a case where the shape of the sheet structure 103 is a rectangle, an aspect ratio of the sheet structure 103 after being stretched is the same as an aspect ratio of the sheet structure 103 before being stretched.

The sheet structure 103 is compressed in the direction B2 in FIG. 1B. Referring to FIG. 3, when the sheet structure 103 is compressed, the aldolases 101 are rotated, and the pores 104 between adjacent aldolases 101 are closed. Since a shape of the aldolase 101 is a square, the dimensions of the sheet structure 103 decrease with a same ratio in any directions in the two-dimensional plane where it is located, and a shape of the sheet structure 103 after being compressed is the same as a shape of the sheet structure 103 before being compressed.

Based on the above, whether being stretched or compressed, the sheet structure 103 is deformed with a same ratio in any directions in the two-dimensional plane. That is, whether being stretched or compressed, the shape of the sheet structure 103 before being deformed is the same as the shape of the sheet structure 103 after being deformed.

Herein, with respect to any sheet structure 103, since a plurality of aldolases 101 are connected through disulfide bonds 102, the sheet structure 103 is not disordered when the aldolases 101 are rotated.

It will be understood by those skilled in the art that, in a case where the Poisson ratio of a material is a negative number (e.g., −1), the material is deformed with a same ratio in any directions in a two-dimensional plane. That is, the shape of the sheet structure 103 before being deformed is the same as the shape of the sheet structure 103 after being deformed. By utilizing Matrix Laboratory, digital image processing is performed on reconstructed two-dimensional transmission electron microscope (TEM) images of dynamic aldolase crystals to evaluate the Poisson ratio of the sheet structure 103.

Figure 4:
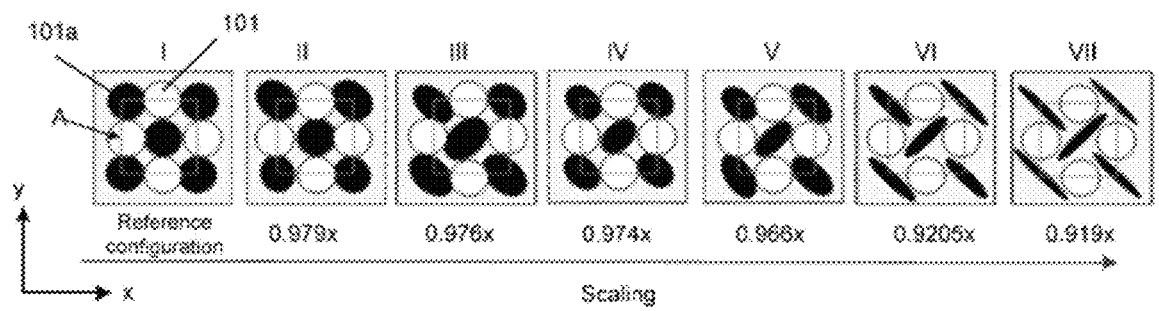
FIG. 4 is a schematic diagram of a microscopic model of a plurality of aldolases, according to some embodiments of the present disclosure.

In FIG. 4, white portions represent aldolases, and black portions represent lattice gaps. As shown in FIG. 4, as the sheet structure 103 is gradually compressed, the microstructure of the sheet structure 103 is shown as a conformational state I, a conformational state II, a conformational state III, a conformational state IV, a conformational state V, a conformational state VI and a conformational state V. It can be seen from FIG. 4 that from the conformational state I to the conformational state V, a size of the aldolase 101 is unchanged, and the lattice gaps 101a between the aldolases are gradually decreased. The representative volume element (RVE) A in FIG. 4 has a rectangular cross-section, and apexes of which correspond to centroids of lattice gaps 101a between aldolases. A boundary of a lattice gap is determined by using the Sobel edge detection method. After that, average values of x and y coordinates of each aldolase at a boundary of the RVE is used to calculate a centroid. After the RVE is selected, a size of the aldolase in each conformational state is measured by defining a boundary of each aldolase. Since the aldolase is assumed to remain rigid in each conformational state, the size of the image determined by the aldolase is substantially the same. The conformational state I in FIG. 4 is taken as a reference to calculate an appropriate amplification factor. Then, positions of vertexes of the RVE in each conformational state are calculated. According to the reference configuration (i.e., the conformation state I) and deformed configuration (i.e., the conformational state II to VII), with respect to each RVE, local variations ex and ey may be calculated. Calculation results of the variations ex and ey in the conformational state I, the conformational state II, the conformational state III, the conformational state IV, the conformational state V, the conformational state VI and the conformational state V are shown in Table 1 below.

TABLE 1

| State | ex (nm) | ey (nm) | Poisson ratio |
| --- | --- | --- | --- |
| I | 4.4 | 4.4 | −1 |
| II | 4.2 | 4.2 | −1 |
| III | 3.9 | 3.895 | −0.999 |
| IV | 3.5 | 3.5 | −1 |
| V | 2.9 | 2.904 | −1.001 |
| VI | 1.8 | 1.802 | −1.001 |
| VII | 1 | 1.001 | −1.001 |

According to the calculation formula of Poisson ratio $$\nu = -\frac{e_y}{e_x} \approx -\frac{\Delta Y}{\Delta X},$$

Poisson ratios of the conformational state I, the conformational state II, the conformation state III, the conformational state IV, the conformational state V, the conformational state VI and the conformational state VII are calculated, and the calculation results are shown in Table 1. It can be seen from Table 1 that the Poisson ratios of the conformational state I, the conformational state II, the conformational state III, the conformational state IV, the conformational state V, the conformational state VI and the conformational state VII are −1 or approximately equal to −1. From the above calculation results, it will be seen that the Poisson ratio of the sheet structure 103 is a negative number, and thus the sheet structure 103 is deformed with a same ratio in any directions in the two-dimensional plane where it is located. That is, the shape of the sheet structure 103 before being deformed is the same as the shape of the sheet structure 103 after being deformed.

Based on the above, the deformable material includes a plurality of sheet structures 103 that are stacked. When the deformable material is stretched in a direction parallel or approximately parallel to a plane where the sheet structure 103 is located, since the shape of each sheet structure 103 after being stretched is the same as the shape thereof before being stretched, a shape of the deformable material after being stretched is the same as a shape of the deformable material before being stretched. When the deformable material is compressed in the direction parallel or approximately parallel to the plane where the sheet structure 103 is located, since the shape of each sheet structure 103 after being compressed is the same as the shape thereof before being compressed, a shape of the deformable material after being compressed is the same as a shape of the deformable material before being compressed. That is, in the direction parallel or approximately parallel to the plane where the sheet structure 103 is located, whether the deformable material is stretched or compressed, the deformable material is deformed with a same ratio in any direction parallel to the plane of the sheet structure 103.

Figure 5:
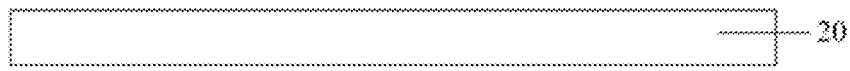
FIG. 5 is a structural diagram of a deformable structure, according to some embodiments of the present disclosure.

Some embodiments of the present disclosure provide a deformable structure 10. As shown in FIG. 5, the deformable structure 10 includes a first deformable layer 20, and a material of the first deformable layer 20 includes the above deformable material.

Herein, a thickness of the first deformable layer 20 is not limited, and may be set according to actual needs.

In addition, a thickness direction of the first deformable layer 20 is the same as a stacking direction of the plurality of sheet structures 103 in the deformable material.

Figure 6A:
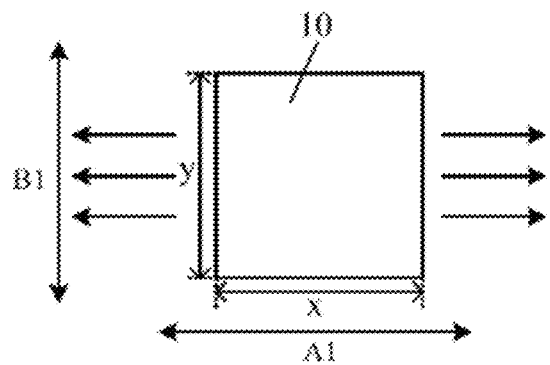
FIG. 6A is a schematic diagram of stretching a deformable structure in the related art in direction A1.
Figure 6B:
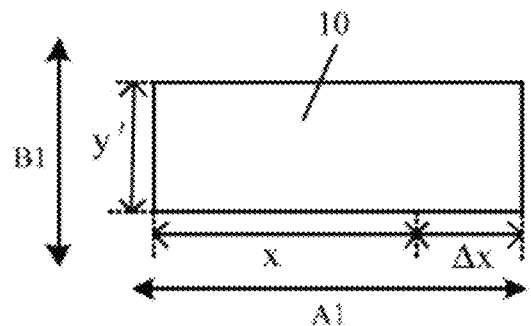
FIG. 6B is a schematic diagram of the deformable structure shown in FIG. 6A after being stretched in the direction A1.

In a case where a deformable structure in the related art is deformed, an aspect ratio of a surface of the deformable structure perpendicular to the thickness direction thereof is changed. As shown in FIG. 6A, if the deformable structure is stretched in the direction A1, as shown in FIG. 6B, a length of the deformable structure in the direction B1 decreases. Referring to FIGS. 6A and 6B, if the deformable structure is stretched in the direction A1, a length of the deformable structure in the direction A1 increases from x to $x+\Delta x$, and the length of the deformable structure in the direction B1 decreases from y to y'. Herein, the direction A1 and the direction B1 in FIGS. 6A and 6B are perpendicular to each other.

Figure 7A:
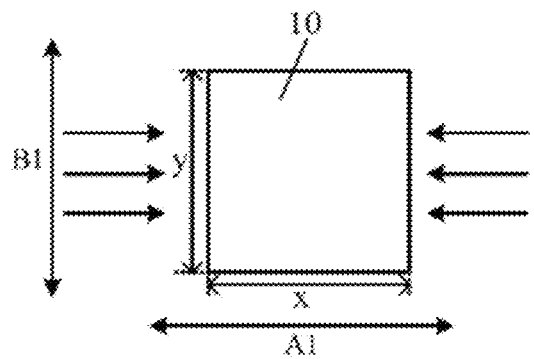
FIG. 7A is a schematic diagram of compressing the deformable structure in the related art in the direction A1.
Figure 7B:
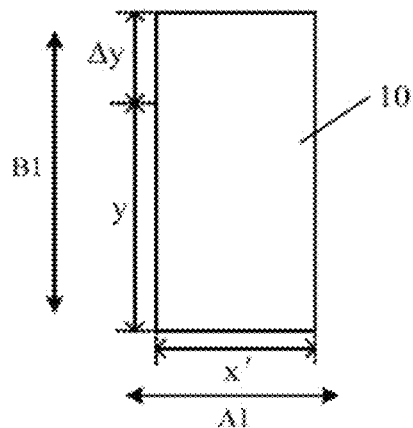
FIG. 7B is a schematic diagram of the deformable structure shown in FIG. 7A after being compressed in the direction A1.

As shown in FIG. 7A, if the deformable structure is compressed in the direction A1, as shown in FIG. 7B, the length of the deformable structure in the direction B1 increases. Referring to FIGS. 7A and 7B, the deformable structure is compressed in the direction A1, the length of the deformable structure in the direction A1 decreases from x to x', and the length of the deformable structure in the direction B1 increases from y to $y+\Delta y$. Herein, the direction A1 and the direction B1 in FIGS. 7A and 7B are perpendicular to each other.

Similarly, in the related art, if the deformable structure is stretched in the direction B1, the length of the deformable structure in the direction A1 decreases. If the deformable structure is compressed in the direction B1, the length of the deformable structure in the direction A1 increases.

Some embodiments of the present disclosure provide a deformable structure 10. The deformable structure 10 includes a first deformable layer 20, and a material of the first deformable layer 20 includes the above deformable material. The deformable structure made of the deformable material has a same shape before and after being deformed, but has a different size before and after being deformed.

When the first deformable layer 20 is deformed, a surface of the first deformable layer 20 that is perpendicular to the thickness direction of the first deformable layer 20 has the same shape before and after being deformed. That is, the surface of the first deformable layer 20 that is perpendicular to the thickness direction of the first deformable layer 20 is deformed with a same ratio in any directions in a plane where the surface is located. Therefore, the shape of the surface of the deformable structure 10 that is perpendicular to the thickness direction of the first deformable layer 20 before deformation is the same as the shape thereof after deformation. That is, the surface of the deformable structure 10 that is perpendicular to the thickness direction of the first deformable layer 20 is deformed with a same ratio in any directions in the plane where the surface is located.

For example, if a shape of the first deformable layer 20 is a rectangle, the surface of the first deformable layer 20 that is perpendicular to the thickness direction of the first deformable layer 20 has the same aspect ratio before and after being deformed.

Figure 8:
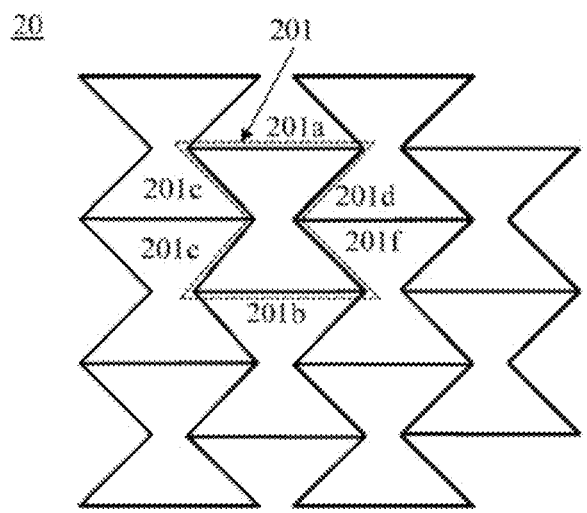
FIG. 8 is a structural diagram of a deformable structure, according to some embodiments of the present disclosure.

Optionally, as shown in FIG. 8, the first deformable layer 20 includes a plurality of telescopic structures 201. A shape of each telescopic structure 201 is hourglass-shaped, and adjacent sides of adjacent telescopic structures 201 overlap.

Referring to FIG. 8, since the shape of the telescopic structure 201 is hourglass-shaped, each telescopic structure 201 includes an upper side 201a and a lower side 201b that are opposite to each other, and further includes an upper left side 201c, an upper right side 201d, a lower left side 201e and a lower right side 201f.

In some embodiments, since the first deformable layer 20 includes a plurality of telescopic structures 201, the shape of each telescopic structure 201 is hourglass-shaped, and adjacent sides of adjacent telescopic structures 201 overlap, it is advantageous for the first deformation layer 20 to deform.

In some embodiments, the material of the first deformable layer 20 further includes magnetizable particles.

A particle size of the magnetizable particle is not limited. In some embodiments, the particle size of the magnetizable particle is 3 μm to 6 μm. For example, the particle size of the magnetizable particle is 5 μm.

Herein, the type of magnetizable particles is not limited. For example, the magnetizable particles include one or more of neodymium iron boron (NdFeB) alloy particles, aluminum nickel cobalt (AlNiCo) alloy particles, iron chromium cobalt (FeCrCo) alloy particles, samarium cobalt (SmCo) alloy particles, ferrite particles, samarium iron nitrogen particles and aluminum iron carbon particles.

In a case where the first deformable layer 20 includes magnetizable particles, when an external magnetic field is applied to the first deformable layer 20, the magnetizable particles may generate torsional moment under action of the magnetic field, and then generate stress, and thus the first deformable layer 20 is deformed under the action of the external magnetic field. If the first deformable layer 20 is deformed in a plane parallel to the first deformable layer 20 by controlling the magnetic field, the shape of the surface of the first deformable layer 20 that is perpendicular to the thickness direction of the first deformable layer 20 is the same before and after being deformed. That is, the surface of the first deformable layer 20 that is perpendicular to the thickness direction of the first deformable layer 20 is deformed with a same ratio in any directions in the plane where the surface is located.

As will be understood by those skilled in the art, when the external magnetic field is applied, the first deformable layer 20 including the magnetizable particles is deformed, and after the external magnetic field is removed, the first deformable layer 20 including the magnetizable particles returns to the original size thereof.

In some embodiments, the material of the first deformable layer 20 further includes at least one of an organic silicone resin, a catalyst, a cross-linking agent and a rheological agent.

Herein, the rheological agent is, for example, nano-scale silica particles, which is used to improve mechanical properties of the material of the first deformable layer 20, such as shear rate and shear stress. A particle size of the nano-scale silica particle is not limited. In some embodiments, the particle size of the silica particle is in a range from 10 nm to 30 nm. For example, the particle size of the silica particle is 30 nm.

Herein, the organic silicone resin may be, for example, silicone rubber.

In addition, the catalyst may be, for example, an organometallic complex, such as dibutyltin dilaurate. The catalyst can shorten the curing catalysis time of the material used to manufacture the deformable layer, and can also make the material used to manufacture the first deformable layer 20 have good retentivity, no wire drawing, and no facade sagging, and can also adjust a viscosity of the material used to manufacture the deformable layer and control the generation of bubbles.

Based on the above, there is no limitation on how to form the first deformable layer 20. In some embodiments, the first deformable layer 20 may be formed by using a 3D printing method.

In some embodiments, the first deformable layer 20 including the magnetizable particles is deformed under the action of the external magnetic field, and becomes larger or smaller. In this way, the first deformable layer 20 may be deformed without a human in contact with the first deformable layer 20, thereby preventing the first deformable layer 20 from being damaged by uneven stress, which is caused by artificially stretching or compressing the first deformable layer 20. In addition, the deformation of the first deformable layer 20 may be controlled by remotely controlling the external magnetic field applied to the first deformable layer 20.

Figure 9:
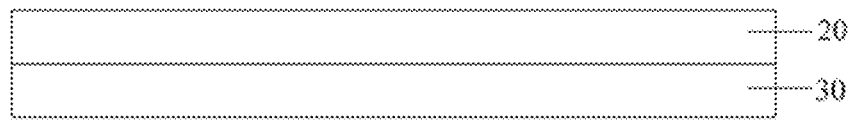
FIG. 9 is a structural diagram of another deformable structure, according to some embodiments of the present disclosure.

In some embodiments, as shown in FIG. 9, the deformable structure 10 further includes a second deformable layer 30, and the first deformable layer 20 and the second deformable layer 30 are stacked. The material of the second deformable layer 30 includes magnetizable particles.

In some embodiments, the first deformable layer 20 and the second deformable layer 30 may be combined together by using a laminating method.

Herein, a shape of the second deformable layer 30 is not limited, and may be designed in any shape as needed.

The particle size of the magnetizable particle is not limited. In some embodiments, the particle size of the magnetizable particle is 3 µm to 6 µm. For example, the particle size of the magnetizable particle is 5 µm.

Herein, the type of magnetizable particles is not limited. For example, the magnetizable particles include one or more of neodymium iron boron (NdFeB) alloy particles, aluminum nickel cobalt (AlNiCo) alloy particles, iron chromium cobalt (FeCrCo) alloy particles, samarium cobalt (SmCo) alloy particles, ferrite particles, samarium iron nitrogen particles and aluminum iron carbon particles.

When an external magnetic field is applied to the second deformable layer 30, since the second deformable layer 30 includes magnetizable particles, and the magnetizable particles generate torque under the action of the magnetic field and then generate stress, the second deformable layer 30 is deformed under the action of the external magnetic field. As will be understood by those skilled in the art, when an external magnetic field is applied, the second deformable layer 30 is deformed, and after the external magnetic field is removed, the second deformable layer 30 returns to the original shape thereof.

Figure 10A:
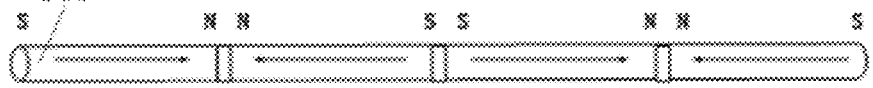
FIG. 10A is a structural diagram of a thin strip made of a material of a second deformable layer, according to some embodiments of the present disclosure.
Figure 10B:
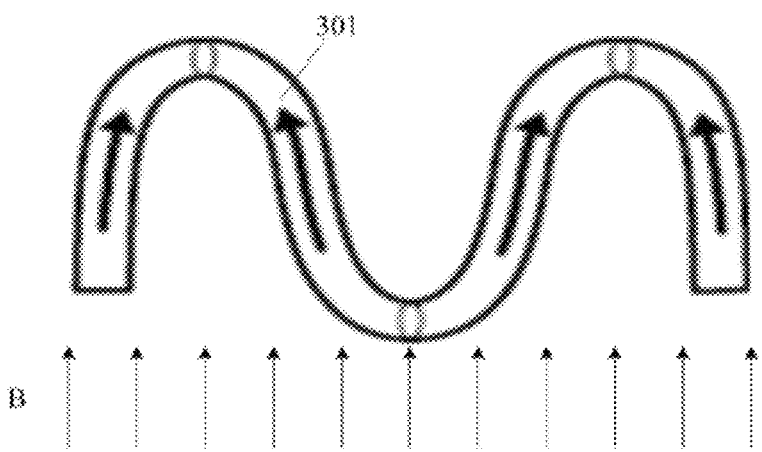
FIG. 10B is a structural diagram of the thin strip shown in FIG. 10A after a magnetic field is applied thereto.

This will be verified through experiments below. As shown in FIG. 10A, a linear thin strip 301 is first manufactured by a printing method, and a direction of the applied magnetic field is switched during printing. A material of the linear thin strip 301 includes magnetizable particles. After a uniform magnetic field B of 200 mT is applied, as shown in FIG. 10B, the linear thin strip 301 is turned into an "m" shape within 0.1 s. After the applied magnetic field is removed within 0.2 s, the thin strip 301 rapidly returns to the original linear shape. As will be seen from the experimental results, the second deformable layer 30 is deformed when the external magnetic field is applied, and the second deformable layer 30 returns to the original shape after the external magnetic field is removed.

In some embodiments, since the second deformable layer 30 and the first deformable layer 20 are stacked, the second deformable layer 30 is deformed under the action of the external magnetic field, meanwhile, it may drive the first deformable layer 20 to deform and become larger or smaller. In this way, the first deformable layer 20 may be deformed without a human in contact with the first deformable layer 20, thereby preventing the first deformable layer 20 from being damaged by uneven stress, which is caused by artificially stretching or compressing the first deformable layer 20. In addition, the deformation of the second deformable layer 30 may be remotely controlled, and further the deformation of the first deformable layer 20 may be controlled.

In some embodiments, the material of the second deformable layer 30 further includes at least one of an organic silicone resin, a catalyst, a cross-linking agent and a rheological agent.

Herein, the rheological agent is, for example, nano-scale silica particles, which is used to improve mechanical properties of the material of the second deformable layer when being printed, such as shear rate and shear stress. The particle size of the nano-scale silica particle is not limited. In some embodiments, the particle size of the silica particle is in a range from 10 nm to 30 nm. For example, the particle size of the silica particle is 30 nm.

Herein, the organic silicone resin may be, for example, silicone rubber.

In addition, the catalyst may be, for example, an organometallic complex, such as dibutyltin dilaurate. The catalyst can shorten the curing catalysis time of the material used to manufacture the deformable layer, and can also make the material used to manufacture the deformable layer have good retentivity, no wire drawing, and no facade sagging, and can also adjust a viscosity of the material of the second deformable layer 30 and control the generation of bubbles.

Based on the above, there is no limitation on how to form the second deformable layer 30. In some embodiments, the second deformable layer 30 may be formed by using a 3D printing method. In some embodiments, the second deformable layer 30 is formed by using the 3D printing method under the condition of applying a magnetic field. In a case where the second deformable layer 30 is manufactured under the condition of applying a magnetic field, it is beneficial to improve apparent viscosity, Young modulus, shear modulus and other properties of the second deformable layer 30, so that the prepared second deformable layer 30 has better performance. This will be verified through experiments below.

First, a material for forming the second deformable layer 30 is manufactured by mixing unmagnetized magnetizable particles (such as neodymium iron boron particles), a rheological agent, an uncured organic silicone resin, a catalyst and a cross-linking agent, and then magnetizing the mixture to saturation under a pulsed magnetic field (magnetic induction of the magnetic field is approximately 2.7 T). The presence of a yield stress in the material of the second deformable layer 30 helps to prevent the dispersed magnetizable particles from gathering.

Figure 11:
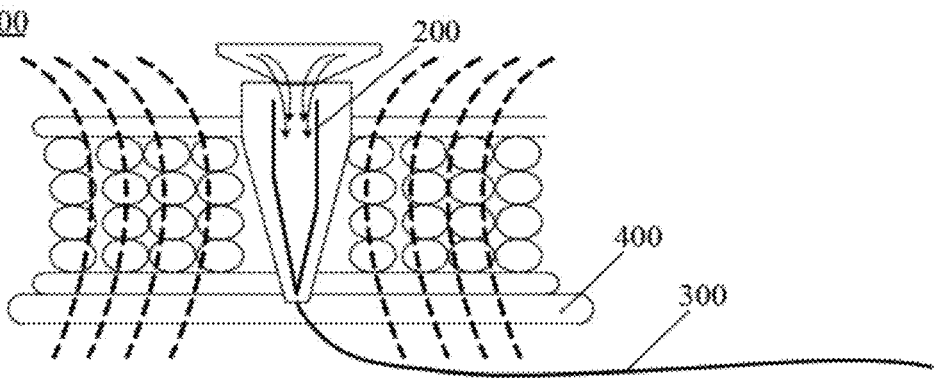
FIG. 11 is a structural diagram of a printing device used in some embodiments of the present disclosure.

Then, as shown in FIG. 11, second deformable layers with a width of 12 mm and a length of 35 mm are printed by using a printing device 100 under a condition of applying a magnetic field and a condition of not applying a magnetic field. Herein, as shown in FIG. 11, a permanent magnet may be used to apply a magnetic field, and the magnetic induction of the magnetic field may be 50 mT. The magnetic field (the dotted lines in FIG. 11 represent the magnetic field) surrounds a nozzle 200, and the nozzle 200 is a tapered nozzle with a diameter of 840 μm. After the printed material is cured, the cured sheet-like second deformable layer is cut into samples with a standard size (4 mm in width and 17 mm in length) for tensile testing. In addition, it is also possible to print samples with a standard size (4 mm in width and 17 mm in length) for tensile testing by using the printing device 100 under a condition of applying a magnetic field and under a condition of not applying a magnetic field. A volume fraction of the magnetizable particles in the second deformable layer 30 is 20%. Afterwards, a control sample is printed by using the printing device 100, a size of the control sample is the standard size described above, and a material of the control sample includes materials in the material of the second deformable layer, except for the magnetizable particles.

A rotational rheometer is used to test mechanical properties of the samples and mechanical properties of the control sample with a standard size.

Figure 12:
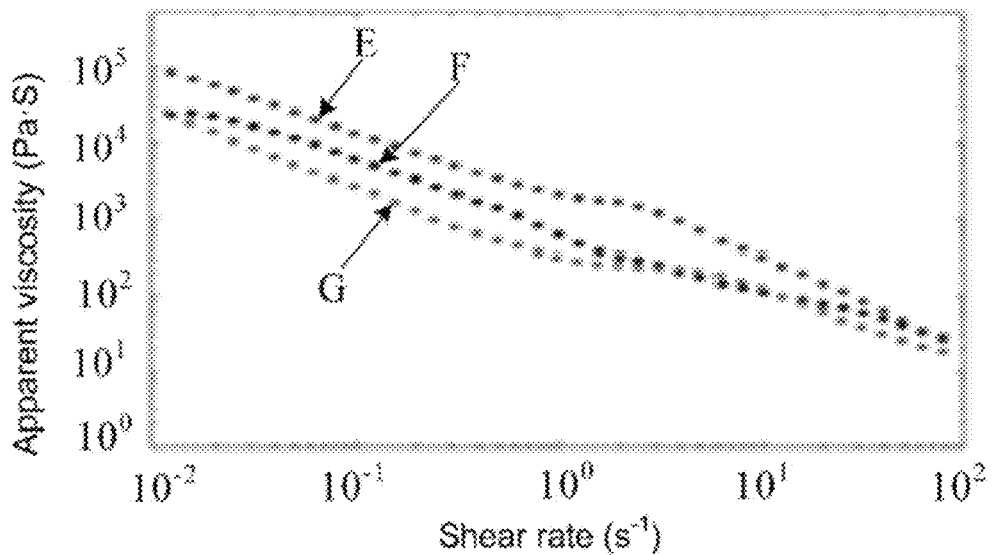
FIG. 12 is a diagram showing a relationship between shear rate and apparent viscosity of the second deformable layer, according to some embodiments of the present disclosure.

Referring to FIG. 12, the horizontal axis represents shear rate, and the vertical axis represents apparent viscosity. The curve E in FIG. 12 shows a relationship between the shear rate and the apparent viscosity of the sample formed under the condition of applying a magnetic field; the curve F shows a relationship between the shear rate and the apparent viscosity of the sample formed under the condition of not applying a magnetic field; and the curve G shows a relationship between the shear rate and the apparent viscosity of the control sample. It can be seen from FIG. 12 that the sample printed under the condition of applying a magnetic field has a greater apparent viscosity.

Figure 13:
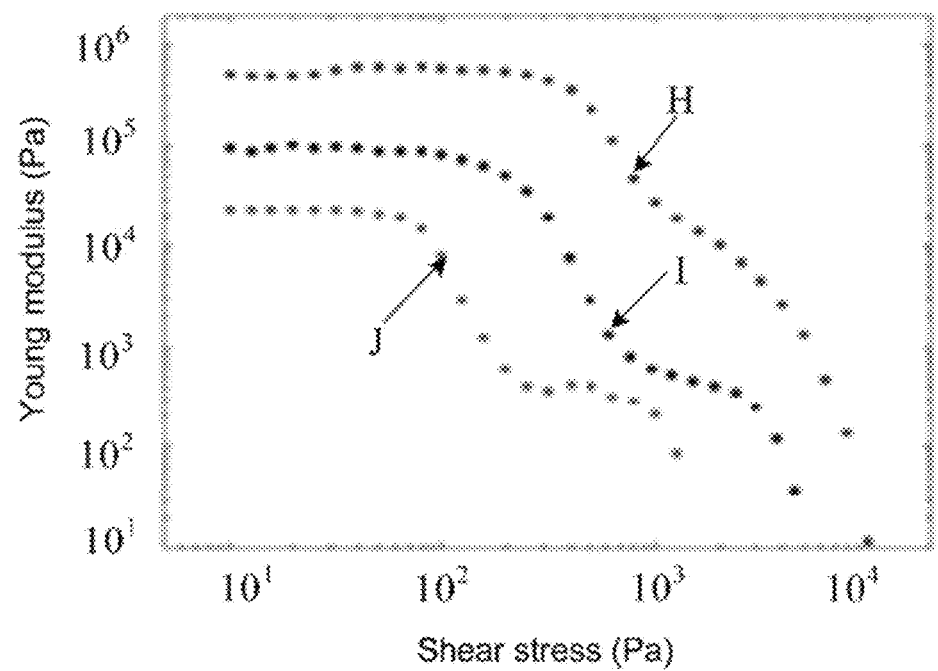
FIG. 13 is a diagram showing a relationship between shear stress and Young modulus of the second deformable layer, according to some embodiments of the present disclosure.

Referring to FIG. 13, the horizontal axis represents shear stress, and the vertical axis represents Young modulus, also known as storage modulus. The curve H in FIG. 13 shows a relationship between the shear stress and the Young modulus of the sample formed under the condition of applying a magnetic field; the curve I shows a relationship between the shear stress and the Young modulus of the sample formed under the condition of not applying a magnetic field; and the curve J shows a relationship between the shear stress and the Young modulus of the control sample. It can be seen from FIG. 13 that the sample printed under the condition of applying a magnetic field has a higher Young modulus.

Figure 14:
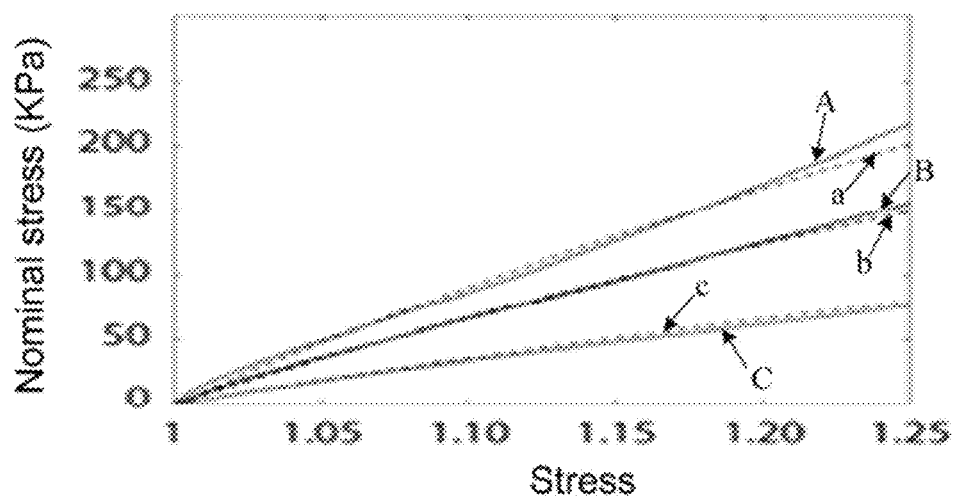
FIG. 14 is a diagram showing a relationship between stress and nominal stress of the second deformable layer, according to some embodiments of the present disclosure.

Referring to FIG. 14, the horizontal axis represents stress, the vertical axis represents nominal stress, and the slope of the straight line represents the shear modulus. The curve A in FIG. 14 shows a relationship between the stress and the nominal stress of the sample formed under the condition of applying a magnetic field, and the curve a represents a relationship between the stress and the nominal stress obtained by fitting the experimental curve A to the neo-Hookean model. According to the curve a, shear modulus $\mu_1$ of the sample formed under the condition of applying a magnetic field may be obtained. The curve B shows a relationship between the stress and the nominal stress of the sample formed under the condition of not applying a magnetic field, and the curve b represents a relationship between the stress and the nominal stress obtained by fitting the experimental curve B to the neo-Hookean model. According to the curve b, shear modulus $\mu_2$ of the sample formed under the condition of not applying a magnetic field may be obtained. The curve C shows a relationship between the stress and the nominal stress of the control sample, and the curve c represents a relationship between the stress and the nominal stress obtained by fitting the experimental curve C to the neo-Hookean model. According to the curve c, shear modulus $\mu_3$ of the control sample may be obtained. It can be seen from FIG. 14 that the sample printed under the condition of applying a magnetic field has a higher shear modulus.

Based on the above, it will be seen that printing the second deformable layer 30 under the condition of applying a magnetic field is beneficial to improve the apparent viscosity, Young modulus, shear modulus and other properties of the second deformable layer 30, so that the prepared second deformable layer 30 has better performance. In this way, in a case where the second deformable layer 30 is deformed, response rate of the deformation of the second deformable layer 30 may be increased.

Figure 23:
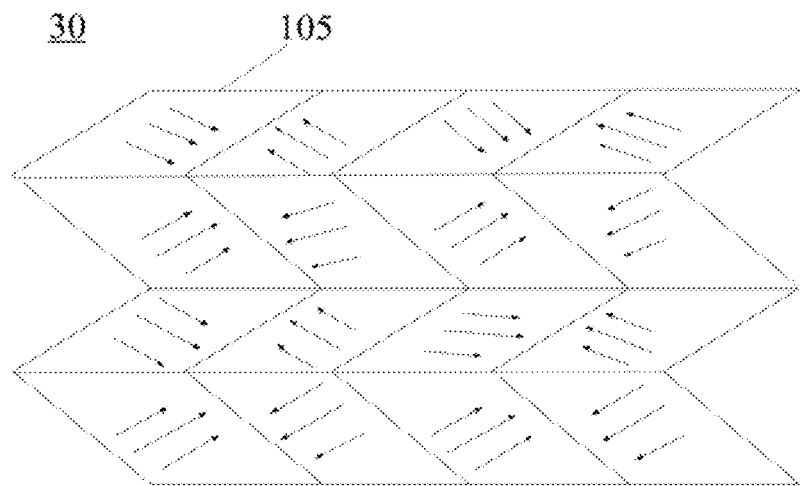
FIG. 23 is a schematic diagram of a plurality of ferromagnetic domains in the second deformable layer, according to some embodiments of the present disclosure.

During the printing process, a magnetic field is applied by a permanent magnet or an electromagnetic coil placed around the nozzle, and a direction of the magnetic field is the same as or opposite to a flow direction of the material of the second deformable layer 30 (as indicated by the arrows in FIG. 11). The applied magnetic field repositions the magnetized magnetizable particles in the direction of the magnetic field, and magnetic polarity of the material of the deposited second deformable layer 30 may be adjusted by changing an application direction or changing a printing direction. In this way, as shown in FIG. 23, the second deformable layer 30 may be coded into complex magnetic domains 105, which depends on magnetic polarity of filaments that are formed by printing and are arranged to form the second deformable layer 30.

In order to avoid interference with coded regions of the second deformable layer 30 by the external magnetic field at the nozzle, as shown in FIG. 11, a magnetic shielding device 400 may be used to reduce magnetic flux density and nozzle stress under the tip of the nozzle, so that the coded magnetic domains are not affected by thermal randomization of oriented particles. After the printing process is completed, the second deformable layer 30 obtained by printing is cured at 120° C. for 1 hour. During this period, due to the presence of the yield stress in the material of the second deformable layer 30 that is uncured, the magnetic domains may be arranged in a form when they are printed, without being affected by temperature.

On this basis, during the printing of the second deformable layer 30, a content of the magnetizable particles, magnetic induction of an external magnetic field, a diameter of a tip of the nozzle 200 all affect the magnetization of the second deformable layer 30. The greater the magnetization of the second deformable layer 30, the greater magnetic moment per unit volume after the second deformable layer 30 is magnetized. The magnetic moment reflects the ability of the second deformable layer 30 to be magnetized. The greater the magnetic moment is, the easier it is for the second deformable layer 30 to be magnetized, and the easier it is for the second deformable layer 30 to be deformed.

The influences of the content of the magnetizable particles, the magnetic induction of the external magnetic field, and the diameter of the tip of the nozzle 200 on the magnetization of the second deformable layer 30 are verified through experiments below.

Figure 15:
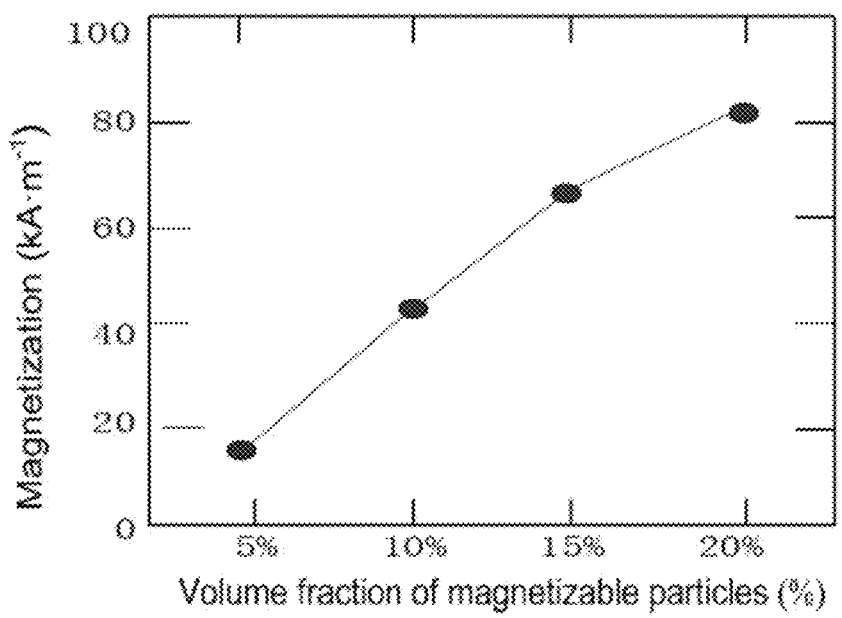
FIG. 15 is a diagram showing a relationship between a volume fraction of magnetizable particles in the second deformable layer and magnetization of the second deformable layer, according to some embodiments of the present disclosure.

For example, as shown in FIG. 15, in a case where the magnetic induction of the external magnetic field applied to the tip of the nozzle 200 is 50 mT, the material of the second deformable layer 30 containing magnetizable particles of different volume fractions is printed by the nozzle 200 with a tip diameter of 410 μm. Referring to FIG. 15, the volume fraction of the magnetizable particles approximately has a linear relation with the magnetization. When the volume fraction of the magnetizable particles increases from 5% to 20%, the magnetization of the second deformable layer 30 increases from 16 kA·m$^{-1}$ to 81 kA·m$^{-1}$.

Figure 16:
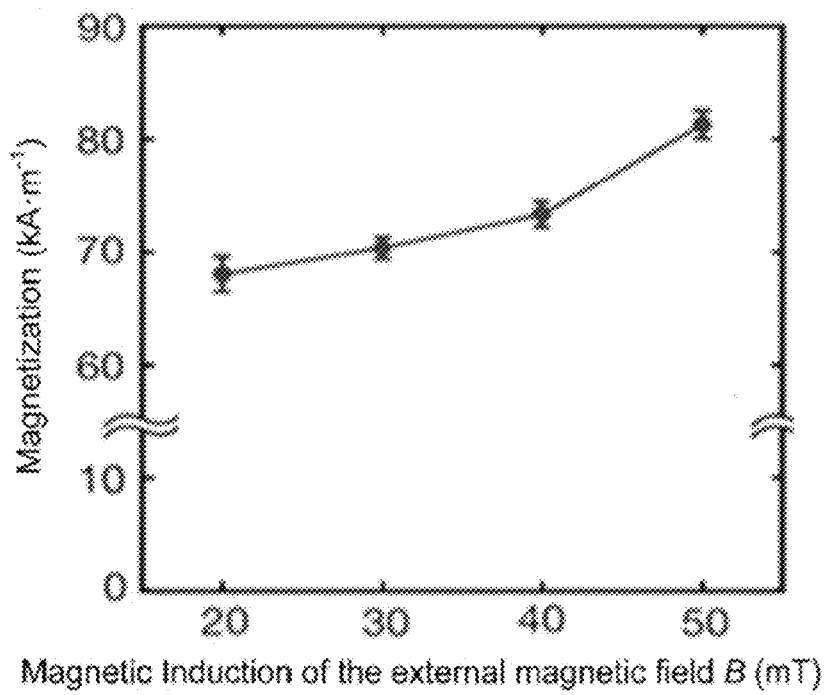
FIG. 16 is a diagram showing a relationship between magnetic induction of an external magnetic field and the magnetization of the second deformable layer, according to some embodiments of the present disclosure.

In a case where the volume fraction of the magnetizable particles is 20% and the diameter of the tip of the nozzle 200 is 410 μm, the magnetic induction of the external magnetic field applied to the tip of the nozzle 200 increases from 20 mT to 50 mT, and the magnetization of the formed second deformable layer 30 is tested. As will be seen from FIG. 16, the magnetic induction of the external magnetic field increases from 20 mT to 50 mT, and the magnetization of the second deformable layer 30 increases from 68 kA·m$^{-1}$ to 81 kA·m$^{-1}$.

Figure 17A:
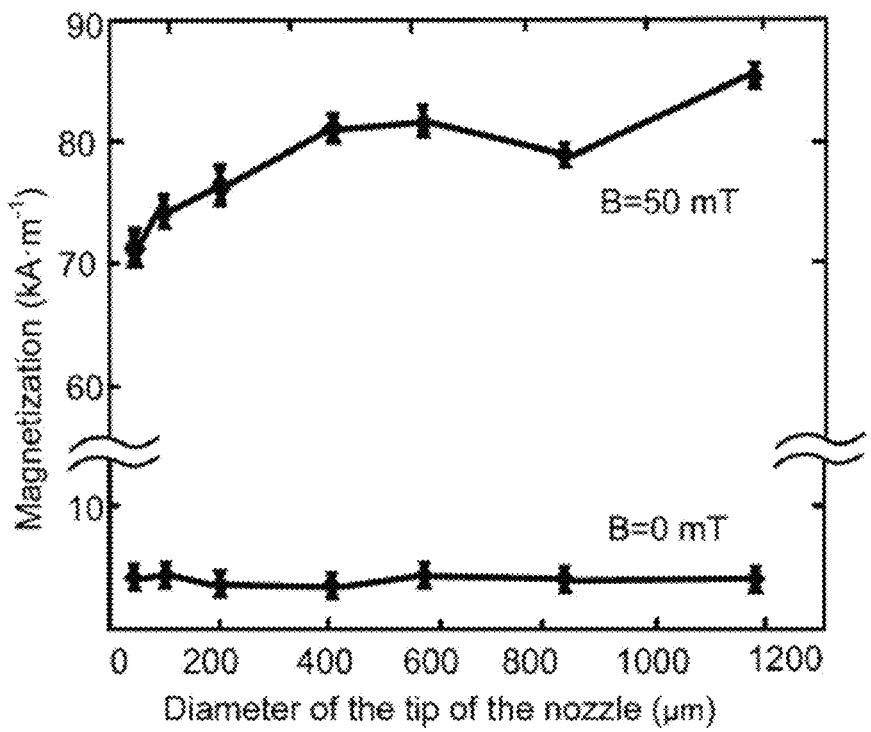
FIG. 17A is a diagram showing a relationship between a diameter of a tip of a nozzle and the magnetization of the second deformable layer, according to some embodiments of the present disclosure.

In addition, in a case where the diameter of the tip of the nozzle is very small (e.g., 50 μm or 100 μm), a diameter of a fiber printed through the nozzle (i.e., a diameter of the filament 300) is greater than the diameter of the tip of the nozzle 200 due to die swelling effect. As shown in FIG. 17A, in a case where the volume fraction of the magnetizable particles is 20% and no external magnetic field exists, the magnetization of the formed second deformable layer 30 is only 5 kA·m$^{-1}$. This is because the magnetizable particles in the formed second deformable layer 30 are randomly oriented. In a case where the volume fraction of the magnetizable particles is 20% and magnetic induction B of the external magnetic field is 50 mT, a relationship curve between the magnetization of the formed second deformable layer 30 and the diameter of the tip of the nozzle 200 is obtained by testing. As shown in FIG. 17A, in a case where the diameter of the tip of the nozzle 200 is less than 600 μm, the diameter of the tip of the nozzle 200 increases, and the magnetization of the formed second deformable layer 30 increases; in a case where the diameter of the tip of the nozzle 200 is greater than 600 μm and less than 850 μm, the diameter of the tip of the nozzle 200 increases, and the magnetization of the formed second deformable layer 30 decreases; in a case where the diameter of the tip of the nozzle 200 is greater than 850 μm, the diameter of the tip of the nozzle 200 increases, and the magnetization of the formed second deformable layer 30 increases. In a case where the diameter of the tip of the nozzle 200 is greater than 200 μm, a ratio between the diameter of the fiber and the diameter of the tip of the nozzle decreases, almost reaching 1.

Based on the above, when the second deformable layer 30 is manufactured, the magnetization of the formed second deformable layer 30 may be made as high as possible by adjusting the content of the magnetizable particles, the magnetic induction of the external magnetic field, the diameter of the tip of the nozzle 200, etc. In this way, the second deformable layer 30 is more easily deformed under the action of the external magnetic field.

Figure 17B:
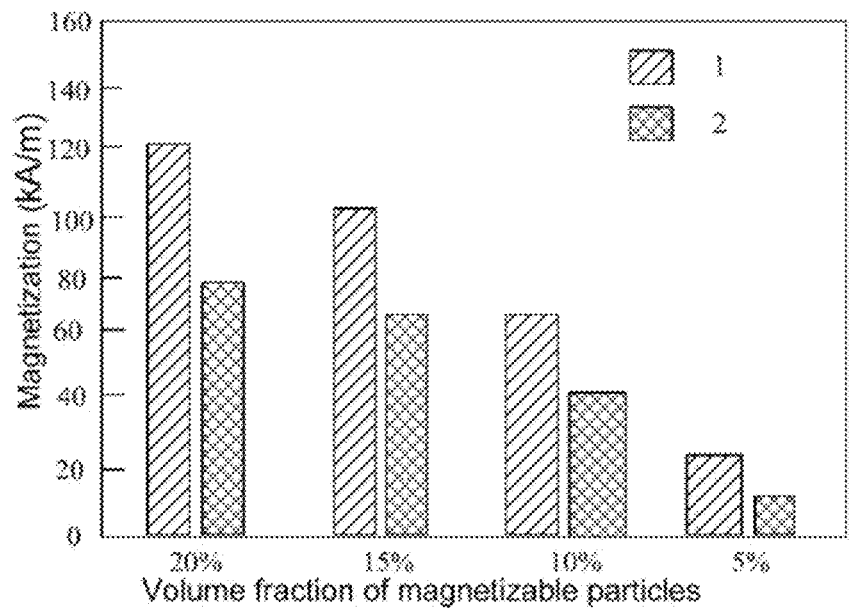
FIG. 17B is a diagram showing a relationship between the volume fraction of magnetizable particles in the second deformable layer and saturation magnetization of the second deformable layer, according to some embodiments of the present disclosure.

As shown in FIG. 17B, 1 represents saturation magnetization of a material used to manufacture the second deformable layer 30, and the material is magnetized to saturation in a pulsed magnetic field (magnetic induction of the magnetic field is approximately 2.7 T). 2 represents magnetization of a plurality of second deformable layers 30 obtained by printing under a condition that magnetic induction of the external magnetic field at the tip of the nozzle 200 is 50 mT.

Herein, volume fractions of the magnetizable particles in the plurality of second deformable layers 30 are different.

As will be seen from FIG. 17B, in a case where the magnetic induction of the external magnetic field at the tip of the nozzle 200 is 50 mT, the magnetization of the second deformable layer 30 obtained by printing is approximately 63% to 64% of the saturation magnetization of the material used to manufacture the second deformable layer 30. Magnetization of the printed samples under the condition that the external magnetic field of 50 mT is applied is relatively high, that is, the material used for printing has a strong ability to be magnetized. Therefore, in a case where the external magnetic field is applied, the formed second deformable layer 30 is easier to deform, and has a faster response speed.

It will be noted that the above description only takes the printing of the second deformable layer 30 as an example. In the embodiments of the present disclosure, any layer including magnetizable particles printed in an external magnetic field has similar effects to the second deformable layer, which will not be described herein again.

Figure 24:
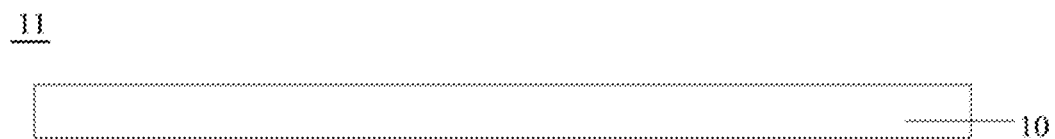
FIG. 24 is a structural diagram of a flexible base, according to some embodiments of the present disclosure.

Some embodiments of the present disclosure provide a flexible base. As shown in FIG. 24, the flexible base 11 includes the deformable structure 10 described above.

Figure 18A:
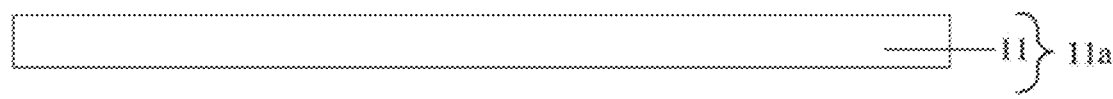
FIG. 18A is a structural diagram of a flexible display device, according to some embodiments of the present disclosure.
Figure 18B:
FIG. 18B is a structural diagram of another flexible display device, according to some embodiments of the present disclosure.

Some embodiments of the present disclosure provide a flexible display device 01 including a flexible base 11a. As shown in FIG. 18A, the flexible base 11a includes the flexible base 11; or as shown in FIG. 18B, the flexible base 11a includes a third deformable layer 13, and a material of the third deformable layer 13 includes two-dimensional silver sulfide ($Ag_2S$).

For example, the flexible display device may be any one of an OLED (organic light-emitting diode) display device, a Micro-LED (light-emitting diode) display device, and the like, which is not limited in the embodiments of the present disclosure.

Figure 19:
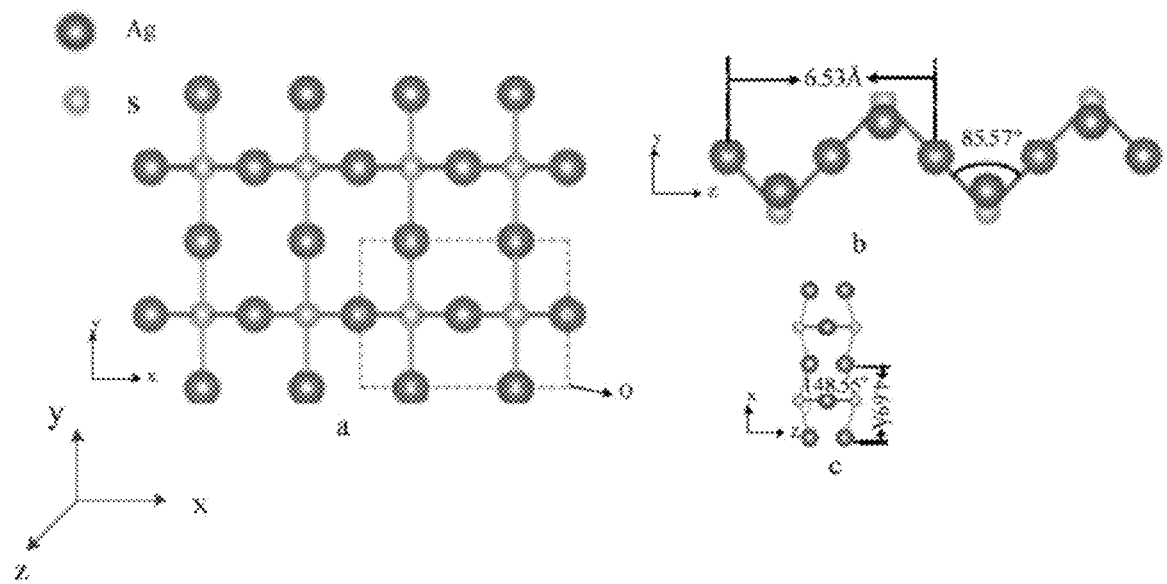
FIG. 19 is a schematic diagram of crystal structures of $Ag_2S$ in a third deformable layer in xy, yz, and xz directions, according to some embodiments of the present disclosure.
Figure 20:
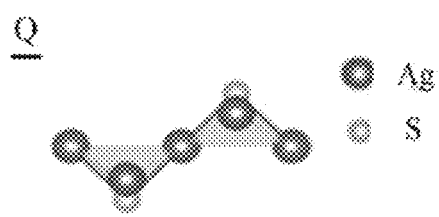
FIG. 20 is a schematic diagram of a three-dimensional structure of portion Q in FIG. 19.

A crystal structure of $Ag_2S$ is shown in FIGS. 19 and 20. In FIG. 19, part a is a crystal structure of $Ag_2S$ in the xy direction, part b is a crystal structure of $Ag_2S$ in the yz direction, and part c is a crystal structure of $Ag_2S$ in the xz direction. FIG. 20 shows a three-dimensional structure of a partial crystal structure of the crystal structure of $Ag_2S$. The crystal structure in FIG. 20 in the xy direction is shown as the portion Q (i.e., the region enclosed by the dash box) in the part a of FIG. 19. The crystal structure of $Ag_2S$ may be viewed as a layered structure in which zigzag-shaped layers are connected by Ag—S bonds. $Ag_2S$ is constructed according to the zigzag-shaped layer in the bulk structure. The unit cell of $Ag_2S$ contains two S atoms and four Ag atoms, featuring an orthorhombic lattice with the lattice constant a and b being 6.53 Å and 4.69 Å, respectively. This structure may be considered as a net made up of two kinds of zigzag Ag—S atomic chains: one is with a large buckle in the x direction, while another is with a small buckle in the y direction. The angle α of Ag—S—Ag in the x direction is 85.57°, and the angle β of Ag—S—Ag in the y direction is 148.55°.

Herein, in a case where the third deformable layer 13 includes two-dimensional $Ag_2S$, when the third deformable layer 13 is deformed, a surface of the third deformable layer 13 that is perpendicular to a thickness direction of the third deformable layer 13 has the same shape before and after being deformed. That is, the surface of the third deformable layer 13 that is perpendicular to the thickness direction of the third deformable layer 13 is deformed with a same ratio in any directions in a plane where the surface is located. In a case where the flexible base 11a includes the third deformable layer 13, and the material of the third deformable layer 13 includes the two-dimensional $Ag_2S$, since the two-dimensional $Ag_2S$ has a special zigzag-shaped buckling structure, when the third deformable layer 13 is stretched or compressed in a plane parallel to the third deformable layer 13, the surface of the third deformable layer 13 that is perpendicular to the thickness direction of the third deformable layer 13 has the same shape before and after being deformed. That is, the surface of the third deformable layer 13 that is perpendicular to the thickness direction of the third deformable layer 13 is deformed with a same ratio in any directions.

Figure 21A:
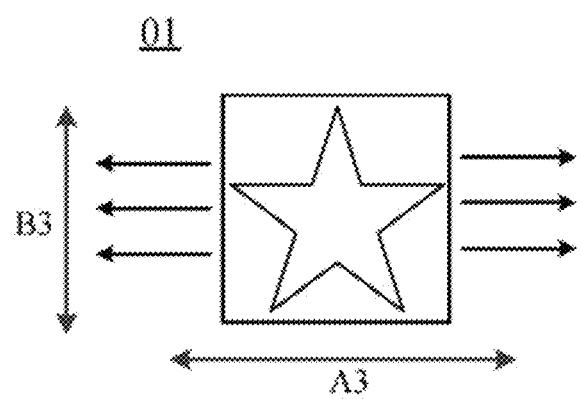
FIG. 21A is a schematic diagram of stretching a flexible display device in the related art in direction A3.
Figure 21B:
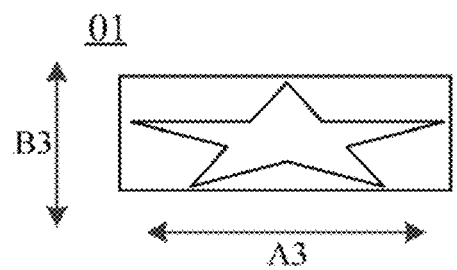
FIG. 21B is a schematic diagram of the flexible display device shown in FIG. 21A after being stretched in the direction A3.

When a flexible base in the related art is deformed, an aspect ratio of a surface of the flexible base perpendicular to a thickness direction thereof is changed. As shown in FIG. 21A, if the flexible base is stretched in the direction A3, as shown in FIG. 21B, a length of the flexible base in the direction B3 decreases. In this way, an image displayed by a flexible display device is stretched in the direction A3 and compressed in the direction B3.

Figure 22A:
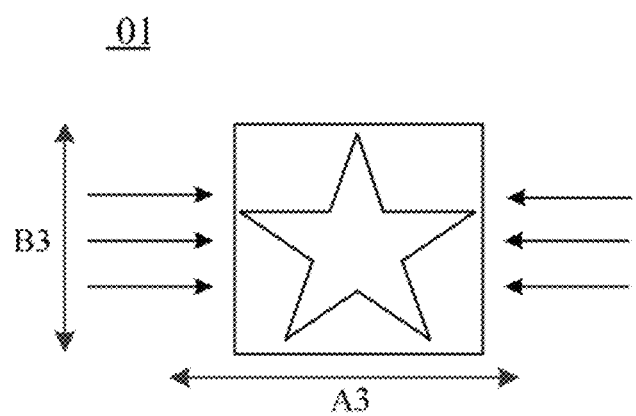
FIG. 22A is a schematic diagram of compressing the flexible display device in the related art in the direction A3.
Figure 22B:
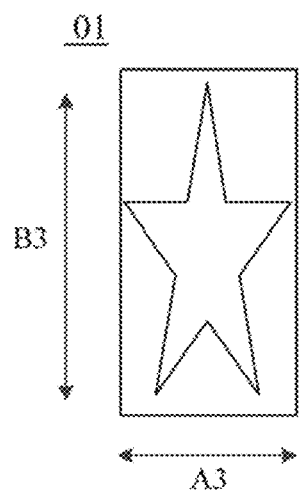
FIG. 22B is a schematic diagram of the flexible display device shown in FIG. 22A after being compressed in the direction A3.

As shown in FIG. 22A, if the flexible base is compressed in the direction A3, as shown in FIG. 22B, the length of the flexible base in the direction B3 increases. In this way, the image displayed by the flexible display device is compressed in the direction A3 and stretched in the direction B3.

Similarly, if the flexible base is stretched in the direction B3, a length of the flexible base in the direction A3 decreases. In this way, the image displayed by the flexible display device is stretched in the direction B3 and compressed in the direction A3. If the flexible base is compressed in the direction B3, a length of the display device in the direction A3 increases. In this way, the image displayed by the flexible display device is compressed in the direction B3 and stretched in the direction A3. When the flexible base in the related art is deformed, the aspect ratio of the surface perpendicular to the thickness direction thereof is changed, thereby causing a proportion of the image displayed by the flexible display device to be changed, and affecting the quality of the image displayed by the flexible display device.

Some embodiments of the present disclosure provide a flexible display device 01. The flexible base 11a in the flexible display device 01 includes the above flexible base 11; or the flexible base 11a includes the third deformable layer 13, and a material of the third deformable layer 13 includes two-dimensional $Ag_2S$.

When the flexible base 11a is deformed, the flexible base 11a has the same shape before and after being deformed. Therefore, when the flexible base 11a is subjected to an external force, a shape of a surface of the flexible base 11a perpendicular to the thickness direction of the flexible base 11a before deformation is the same a shape thereof after deformation. That is, the surface of the flexible base 11a perpendicular to the thickness direction of the flexible base 11a is deformed with a same ratio in any directions in a plane where the surface is located (for example, if the shape of the surface of the flexible base 11a perpendicular to the thickness direction of the flexible base 11a is a rectangle, an aspect ratio of the surface of the flexible base 11a perpendicular to the thickness direction of the flexible base 11a before deformation is the same as an aspect ratio thereof after deformation). In this way, when the flexible display device 01 is deformed, the proportion of the image displayed by the flexible display device 01 is not changed, and thus the display effect will not be influenced. On this basis, since the flexible base 11a may shrink, the flexible display device 01 including the flexible base 11a may also shrink, thereby facilitating collection and storage of the flexible display device 01.

In some embodiments, the material of the third deformable layer 13 further includes magnetizable particles.

Herein, the magnetizable particles may include one or more of neodymium iron boron alloy particles, aluminum nickel cobalt alloy particles, iron chromium cobalt alloy particles, samarium cobalt alloy particles, ferrite particles, samarium iron nitrogen particles and aluminum iron carbon particles. The third deformable layer 13 including the magnetizable particles is deformed under the action of the external magnetic field and becomes larger or smaller. In addition, the external magnetic field applied to the third deformable layer 13 may be remotely controlled, and the deformation of the third deformable layer 13 may be controlled.

Herein, in a case where the third deformable layer 13 includes two-dimensional $Ag_2S$ and magnetizable particles, referring to the above first deformable layer 20, it will be seen that the third deformable layer 13 is deformed under the action of the external magnetic field. If the magnetic field is controlled to make the third deformable layer 13 deformed in a plane parallel to the third deformable layer 13, the shape of the surface of the third deformable layer 13 that is perpendicular to the thickness direction of the third deformable layer 13 before deformation is the same as the shape thereof after deformation. That is, the surface of the third deformable layer 13 that is perpendicular to the thickness direction of the third deformable layer 13 is deformed with a same ratio in any directions in the plane where the surface is located.

In some embodiments, the material of the third deformable layer 13 further includes at least one of an organic silicone resin, a catalyst, a cross-linking agent and a rheological agent.

Herein, the rheological agent is, for example, nano-scale silica particles, which is used to improve mechanical properties of the material of the third deformable layer 13, such as shear rate and shear stress. The particle size of the nano-scale silica particle is not limited. In some embodiments, the particle size of the silica particle is in a range from 10 nm to 30 nm. For example, the particle size of the silica particle is 30 nm.

Herein, the organic silicone resin may be, for example, silicone rubber.

In addition, the catalyst may be, for example, an organometallic complex, such as dibutyltin dilaurate. The catalyst can shorten the curing catalysis time of the material used to manufacture the deformable layer, and can also make the material used to manufacture the third deformable layer 13 have good retentivity, no wire drawing, and no facade sagging, and can also adjust a viscosity of the material used to manufacture the deformable layer and control the generation of bubbles.

Figure 18C:
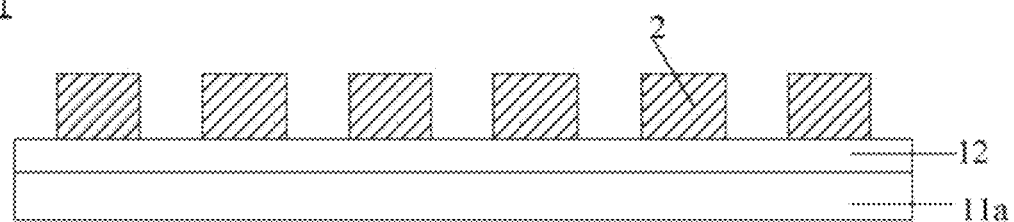
FIG. 18C is a structural diagram of yet another flexible display device, according to some embodiments of the present disclosure.

In some embodiments, as shown in FIG. 18C, the flexible display device 01 further includes a driving circuit layer 12 disposed on the flexible base 11a, and a plurality of micro LED particles 2 disposed on a side of the driving circuit layer 12 away from the flexible base 11a. The driving circuit layer 12 is used to drive the plurality of micro LED particles 2 to emit light, so that the flexible display device 01 displays images.

Herein, an arrangement manner of the flexible base 11a in the flexible display device 01 is not limited, and may be set correspondingly according to actual needs.

At present, strain sensors are required to be able to detect subtle strains in wearable fields, robotic fields and electronic skin fields, etc. The smaller the strain that can be detected by a strain sensing element in the strain sensor is, the higher the sensitivity of the strain sensor is. In a stretchable strain sensor, the active material is drawn by stretching, which is conductive to improving the sensitivity, while the active material is squeezed together by compressing, which limits the improvement of sensitivity. When the strain sensing element in the related art is stretched in one direction in a plane, the strain sensing element shrinks in another direction perpendicular to the direction in the plane. Therefore, it is difficult to improve the sensitivity of the strain sensor in the related art.

Figure 25A:
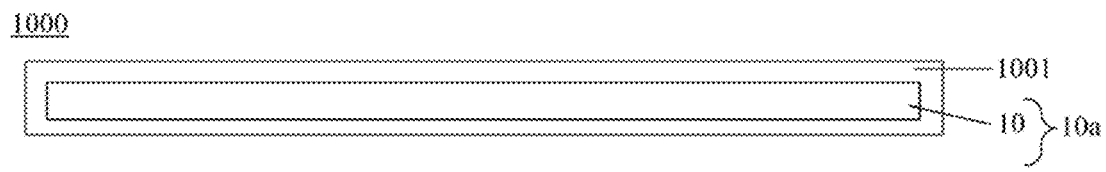
FIG. 25A is a structural diagram of a strain sensor, according to some embodiments of the present disclosure.
Figure 25B:
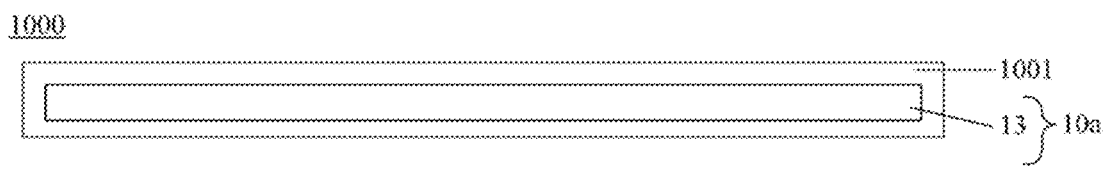
FIG. 25B is a structural diagram of another strain sensor, according to some embodiments of the present disclosure.

Some embodiments of the present disclosure provide a strain sensor 1000. The strain sensor 1000 includes a strain sensing element 1001. The strain sensing element 1001 is deformed when subjected to a force, and the strain sensing element 1001 includes a deformable structure 10a. As shown in FIG. 25A, the deformable structure 10a includes the deformable structure 10; or as shown in FIG. 25B, the deformable structure 10a includes the third deformable layer 13, and the material of the third deformable layer 13 includes two-dimensional $Ag_2S$.

Herein, the strain sensing element 1001 includes an elastic element.

In a case where the material of the third deformable layer 13 includes two-dimensional $Ag_2S$, when the third deformable layer 13 is deformed, the surface of the third deformable layer 13 perpendicular to the thickness direction thereof has the same shape before and after deformation. This has been described in detail in the above embodiments, and will not be described herein again.

Some embodiments of the present disclosure provide a strain sensor 1000. The strain sensor 1000 includes a strain sensing element 1001, and the strain sensing element 1001 includes a deformable structure 10a. The deformable structure 10a includes the deformable structure 10 described above; or the deformable structure 10a includes the third deformable layer 13, and the material of the third deformable layer 13 includes two-dimensional $Ag_2S$.

When the deformable structure 10a is deformed, a shape of the deformable structure 10a before deformation is the same as a shape of the deformable structure 10a after deformation. Therefore, when the strain sensing element 1001 is subjected to a force, a shape of the strain sensing element 1001 before deformation is the same as a shape of the strain sensing element 1001 after deformation. That is, the strain sensing element 1001 is deformed with a same ratio. For example, in an example where a shape of a cross section of the strain sensing element 1001 is a rectangle, when the strain sensing element 1001 is stretched in a length direction of the rectangle, the strain sensing element 1001 extends in a width direction of the rectangle; and when the strain sensing element 1001 is compressed in the length direction of the rectangle, the strain sensing element 1001 shrinks in the width direction of the rectangle, thereby improving the sensitivity of the strain sensor 1001.

In some embodiments, in a case where the deformable structure 10a includes the third deformable layer 13, the material of the third deformable layer 13 further includes magnetizable particles. Beneficial effects of the third deformable layer 13 including the magnetizable particles may be referred to the foregoing content, which will not be described herein again.

In some embodiments, in a case where the deformable structure 10a includes the third deformable layer 13, the material of the third deformable layer 13 further includes at least one of an organic silicone resin, a catalyst, a cross-linking agent and a rheological agent.

Herein, the rheological agent is, for example, nano-scale silica particles, which is used to improve mechanical properties of the material of the third deformable layer 13, such as shear rate and shear stress. The particle size of the nano-scale silica particle is not limited. In some embodiments, the particle size of the silica particle is 10 to 30 μm. For example, the particle size of the silica particle is 30 nm.

Herein, the organic silicone resin may be, for example, silicone rubber.

In addition, the catalyst may be, for example, an organometallic complex, such as dibutyltin dilaurate. The catalyst can shorten the curing catalysis time of the material used to manufacture the deformable layer, and can also make the material used to manufacture the third deformable layer 13 have good retentivity, no wire drawing, and no facade sagging, and can also adjust the viscosity of the material of manufacturing the deformable layer, and control the generation of bubbles. Herein, an arrangement manner of the strain sensing element 1001 in the strain sensor 1000 is not limited, which may be set correspondingly as needed.

It will be noted that the deformable structure and the flexible base may be applied to other fields in addition to flexible display devices and strain sensors. For example, the deformable structure and the flexible base may be used in protective clothing, protective equipment, protective caps, bulletproof vests, leg guards, knee pads or sheaths.

The foregoing descriptions are merely specific implementation manners of the present disclosure, but the protection scope of the present disclosure is not limited thereto. Any changes or replacements that a person skilled in the art could conceive of within the technical scope of some embodiments of the present disclosure shall be included in the protection scope of the present disclosure. Therefore, the protection scope of the present disclosure shall be subject to the protection scope of the claims.

What is claimed is:

1. A deformable structure, comprising a first deformable layer, wherein a material of the first deformable layer includes a deformable material;
   the deformable material includes a plurality of sheet structures that are stacked, and each sheet structure includes a plurality of aldolases;
   a molecular model of an aldolase is equivalent to a square on a plane where the sheet structure is located, and the aldolase has amino acid residues at each of four corners thereof;
   in one sheet structure, amino acid residues at four corners of each aldolase are connected to amino acid residues of four aldolases around the aldolase through four disulfide bonds, respectively; and
   in two adjacent sheet structures, amino acid residues of two adjacent aldolases are connected through at least one disulfide bond.

2. The deformable structure according to claim 1, wherein disulfide bonds are formed by oxidation of cysteines connected to amino acid residues of the aldolases.

3. The deformable structure according to claim 1, wherein a Poisson ratio of the deformable material is a negative number.

4. The deformable structure according to claim 1, wherein the material of the first deformable layer further includes magnetizable particles.

5. The deformable structure according to claim 4, wherein the magnetizable particles include one or more of neodymium iron boron alloy particles, aluminum nickel cobalt alloy particles, iron chromium cobalt alloy particles, samarium cobalt alloy particles, ferrite particles, samarium iron nitrogen particles and aluminum iron carbon particles.

6. The deformable structure according to claim 1, wherein the material of the first deformable layer further includes at least one of an organic silicone resin, a catalyst, a cross-linking agent and a rheological agent.

7. The deformable structure according to claim 1, further comprising a second deformable layer, wherein the first deformable layer and the second deformable layer are stacked in a thickness direction of the deformable structure; and
a material of the second deformable layer includes magnetizable particles.

8. The deformable structure according to claim 7, wherein the magnetizable particles include one or more of neodymium iron boron alloy particles, aluminum nickel cobalt alloy particles, iron chromium cobalt alloy particles, samarium cobalt alloy particles, ferrite particles, samarium iron nitrogen particles and aluminum iron carbon particles.

9. The deformable structure according to claim 7, wherein the material of the second deformable layer further includes at least one of an organic silicone resin, a catalyst, a cross-linking agent and a rheological agent.

10. A flexible base, comprising the deformable structure according claim 1.

11. A flexible display device, comprising
the flexible base according to claim 10, or
a third deformable layer, wherein a material of the third deformable layer includes two-dimensional silver sulfide ($Ag_2S$) and magnetizable particles.

12. The flexible display device according to claim 11, wherein the material of the third deformable layer further includes at least one of an organic silicone resin, a catalyst, a cross-linking agent and a rheological agent.

13. The flexible display device according to claim 11, further comprising:
a driving circuit layer disposed on the flexible base; and
a plurality of micro light-emitting diode particles disposed on a side of the driving circuit layer away from the flexible base.

14. The flexible base according to claim 10, wherein the deformable structure includes a second deformable layer,
the first deformable layer and the second deformable layer are stacked in a thickness direction of the deformable structure; and
a material of the second deformable layer includes magnetizable particles.

15. A strain sensor, comprising a strain sensing element, the strain sensing element being deformed when subjected to a force; wherein
the strain sensing element includes the deformable structure according to claim 1; or
the strain sensing element includes a third deformable layer, and a material of the third deformable layer includes two-dimensional silver sulfide ($Ag_2S$) and magnetizable particles.

16. The strain sensor according to claim 15, wherein the material of the third deformable layer further includes at least one of an organic silicone resin, a catalyst, a cross-linking agent and a rheological agent.

17. The strain sensor according to claim 15, wherein the deformable structure includes a second deformable layer,
the first deformable layer and the second deformable layer are stacked in a thickness direction of the deformable structure; and
a material of the second deformable layer includes magnetizable particles.

\* \* \* \* \*